(12) United States Patent
Hwang et al.

(10) Patent No.: US 8,410,594 B2
(45) Date of Patent: Apr. 2, 2013

(54) INTER-STACKING MODULE SYSTEM

(75) Inventors: Kwang Soon Hwang, Seoul (KR);
Youngcheol Kim, Young In-si (KR);
Hun Teak Lee, Ichon (KR); Koo Hong Lee, Seoul (KR)

(73) Assignee: Stats Chippac Ltd., Singapore (SG)

( * ) Notice: Subject to any disclaimer, the term of this patent is extended or adjusted under 35 U.S.C. 154(b) by 55 days.

(21) Appl. No.: 11/330,930

(22) Filed: Jan. 11, 2006

(65) Prior Publication Data

US 2007/0158858 A1  Jul. 12, 2007

(51) Int. Cl.
*H01L 23/02* (2006.01)
(52) U.S. Cl. ............... 257/686; 257/E23.001; 438/6
(58) Field of Classification Search .......... 257/686, 257/784, 685, 723, 726, E25.031–E25.032, 257/E23.042; 438/6, 28, 66, 67, 107, 109, 438/406, 455–459, FOR. 211–FOR. 220, 438/FOR. 365–FOR. 368
See application file for complete search history.

(56) References Cited

U.S. PATENT DOCUMENTS

| | | | |
|---|---|---|---|
| 6,916,682 B2 | 7/2005 | Gerber et al. | |
| 6,933,598 B2 | 8/2005 | Karnezos | |
| 6,943,450 B2 | 9/2005 | Fee et al. | |
| 6,951,774 B2 | 10/2005 | Nakamura et al. | |
| 6,951,982 B2 | 10/2005 | Chye et al. | |
| 7,071,568 B1 * | 7/2006 | St. Amand et al. | 257/777 |
| 2006/0012018 A1 * | 1/2006 | Karnezos et al. | 257/678 |

* cited by examiner

*Primary Examiner* — Tony Tran
(74) *Attorney, Agent, or Firm* — Ishimaru & Associates LLP

(57) ABSTRACT

An inter-stacking module system is provided by mounting an integrated circuit on a first substrate, the first substrate having a first bond pad, mounting an inter-stacking module substrate over the integrated circuit, forming an inter-stacking module bonding pad on the inter-stacking module substrate, and connecting bond wires between the inter-stacking module bonding pad and the first bond pad.

8 Claims, 2 Drawing Sheets

US 8,410,594 B2

INTER-STACKING MODULE SYSTEM

TECHNICAL FIELD

The present invention relates generally to integrated circuit package systems, and more particularly to a system for package in package devices having inter-stacking modules.

BACKGROUND ART

In today's multi-function world, ever smaller integrated circuit packages are packed with feature delivering semiconductor devices. For instance a processor chip for a cell phone will include the processor, ROM, RAM and peripheral devices for power management and I/O. Each of these functions has its own state of the art technology or manufacturing "sweet spot". The result is several different technology nodes might be assembled in a single package.

The initial driver of such a packaging technology was computer memory. As the state of the art improved and reliability of multi-die packages improved, other functions started to be drawn into the packaging revolution. All manner of functions were joined in a single package. At first manufacturers tried to maintain the same technology types in a single package. As these packages were successful and the demand for additional functions reached a crescendo, companies started mixing different technology nodes in the same package. An analog bipolar die could be packaged with a CMOS microprocessor, or a 0.13 µm communication switch could be packaged with a 0.25 µm oscillator circuit.

The success of the mixed technology packages opened the industry to innovative packaging schemes that stack or parallel multiple chips and sometime include embedding other packaged devices in the larger package. In these approaches, the interconnect can be through flip chip attach, wire bond or other internal substrates. Many of these devices are very complex. They deliver a complete function in a single integrated circuit footprint, significantly simplifying the printed circuit board design. As the bounds of innovation were pushed and more elaborate package stacks were attempted, manufacturing and reliability issues came to the fore. In some cases the yield issues made the packages too difficult to bring to full production.

Many of the reliability issues are a result of component movement during the many thermal transitions of the assembly process. As substrates and integrated circuit die are heated for attach processes and wire bonding, they have a tendency to warp and flex from their resting position. Bond wires can interfere with the solder mask on the edge of a buried substrate in the module. The result can be broken connections or reduced pull strength on the bond wires. Both of these effects result in an inoperative device or one with reliability problems.

Thus, a need still remains for an assembly process and apparatus that will allow reliable interconnects to the buried stacking module. In view of the increasing demand for multiple integrated circuit packages, it is increasingly critical that answers be found to these problems. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an inter-stacking module system comprising mounting an integrated circuit on a first substrate, the first substrate having a first bond pad, mounting an inter-stacking module substrate over the integrated circuit, forming an inter-stacking module bonding pad on the inter-stacking module substrate, and connecting bond wires between the inter-stacking module bonding pad and the first bond pad.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
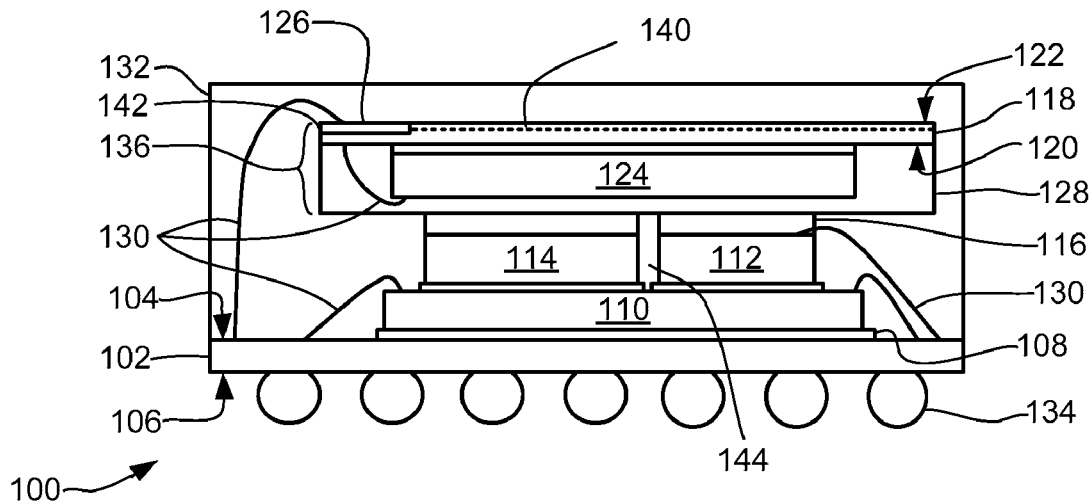
FIG. 1 is a cross-sectional view of an inter-stacking module system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the drawing FIGs. The same numbers are used in all the drawing FIGs. to relate to the same elements.

The term "horizontal" as used herein is defined as a plane parallel to the conventional plane or surface of the integrated circuit surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an inter-stacking module system 100 in an embodiment of the present invention. The cross-sectional view of the inter-stacking module system 100 includes a first substrate 102, having a first top side 104 and a first bottom side 106, a die attach material 108, a first integrated circuit 110, mounted on the first top side 104 of the first substrate 102, a second integrated circuit 112, attached above the first integrated circuit 110 and spaced away from an integrated circuit spacer 114. The integrated circuit spacer 114 and the second integrated circuit 112 have bottom surfaces that are substantially coplanar. The cross-sectional view also shows a stacking module spacer 116, an inter-stacking module substrate 118, having a module substrate top 120 and a module substrate bottom 122, a module integrated circuit 124 mounted on the module substrate top 120 and having a direct electrical connection by bond wires 130 with an inter-stacking module bonding pad 126, attached to the module substrate bottom 122.

A first molding compound 128 encases the module integrated circuit 124 and the module substrate top 120. Bond wires 130 attach the inter-stacking module bonding pad 126 to the first top side 104 of the first substrate 102. A second molding compound 132 forms the package in package device body and electrical interconnects 134, such as solder balls, attach to the first bottom side 106 of the first substrate 102.

The first integrated circuit 110 attaches to the first substrate 102 with the die attach material 108. The die attach process includes placing the first substrate 102 and the first integrated circuit 110 in an oven (not shown) to cure the die attach material 108. The bond wires 130 electrically connect the first die to the first top side 104 of the first substrate 102. The second integrated circuit 112 and the integrated circuit spacer 114 attach directly on the surface of the first integrated circuit 110 with the die attach material 108. The integrated circuit spacer 114 is positioned with a space 144 between the integrated circuit spacer 114 and the second integrated circuit 112. The center of the inter-stacking module substrate 118 is over the space 144. The substrate assembly is put back in the oven (not shown) for a second integrated circuit attach curing process. The second integrated circuit 112 electrically connects to the first top side 104 of the first substrate 102 using the bond wires 130.

The stacking module spacer 116 attaches to the second integrated circuit 112 and the integrated circuit spacer 114. A stacking module 136 consists of the inter-stacking module substrate 118, including the inter-stacking module bonding pad 126, the module integrated circuit 124, the bond wires 130 and the first molding compound 128, attached to the stacking module spacer 116. The bond wires 130 electrically connect the inter-stacking module bonding pad 126 to the first top side 104 of the first substrate 102.

The bond wires 130 are further at the outer edge of the inter-stacking module bonding pad 126, which is at the outer edge of the inter-stacking module substrate 118 without any of the material of the inter-stacking module substrate 118 intervening. The inter-stacking module bonding pads 126 is exposed from an outer peripheral, vertical side 142 of the inter-stacking module substrate 118 and from the module substrate bottom 122, with a solder mask 140 spaced away from all of the inter-stacking module bonding pads 126 on the outer peripheral vertical side 142 includes the solder mask 140 isolated from a region between all of the inter-stacking module bonding pads 126. The outer peripheral vertical side 142 is an extent of the inter-stacking module substrate 136 and between the module substrate top 120 and the module substrate bottom 122.

The second molding compound 132 encases the stacking module 136, the first integrated circuit 110, the second integrated circuit 112, the integrated circuit spacer 114, the stacking module spacer 116, the bond wires 130 and the first top side 104 of the first substrate 102. The electrical interconnects 134, such as solder balls, solder columns, stud bumps or pins, form the interface to the next level system (not shown).

Figure 2:
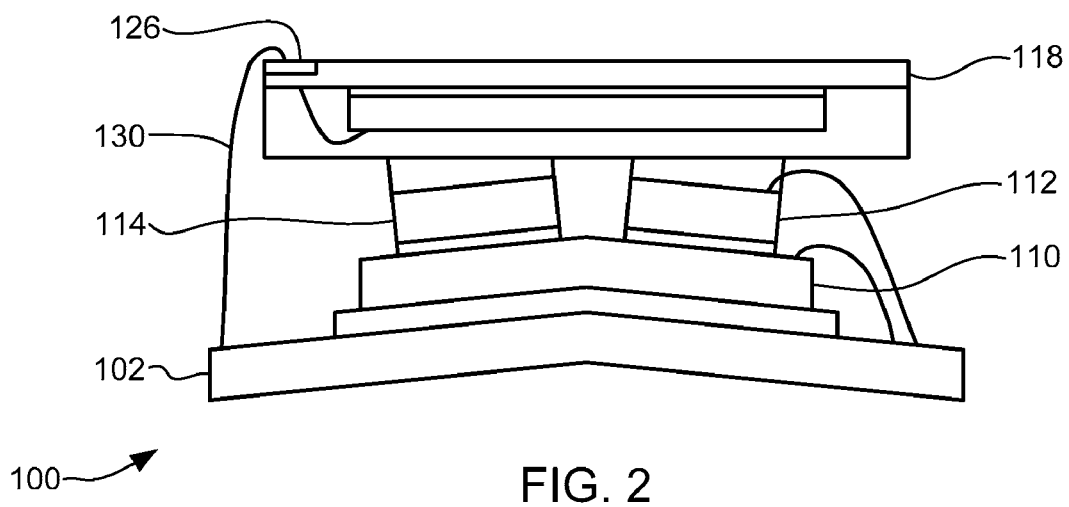
FIG. 2 is a cross-sectional view of the inter-stacking module system of FIG. 1, in a heat block wire bonding phase.

Referring now to FIG. 2, therein is shown a cross-sectional view of the inter-stacking module system 100, in a heat block wire bonding phase. The cross-sectional view shows the first substrate 102 and the first integrated circuit 110 having a warped condition due to the elevated temperature in the heat block wire bonding phase of manufacture. The second integrated circuit 112 and the integrated circuit spacer 114 are shifted in position due to the mechanical stress caused by the heat block wire bonding process applied to the inter-stacking module bonding pad 126. This shifting of position causes stress on the bond wires 130. The inter-stacking module bonding pad 126 reduces the stress exerted on the bond wires 130, because there is no solder mask at the edge of the inter-stacking module substrate 118.

Figure 3:
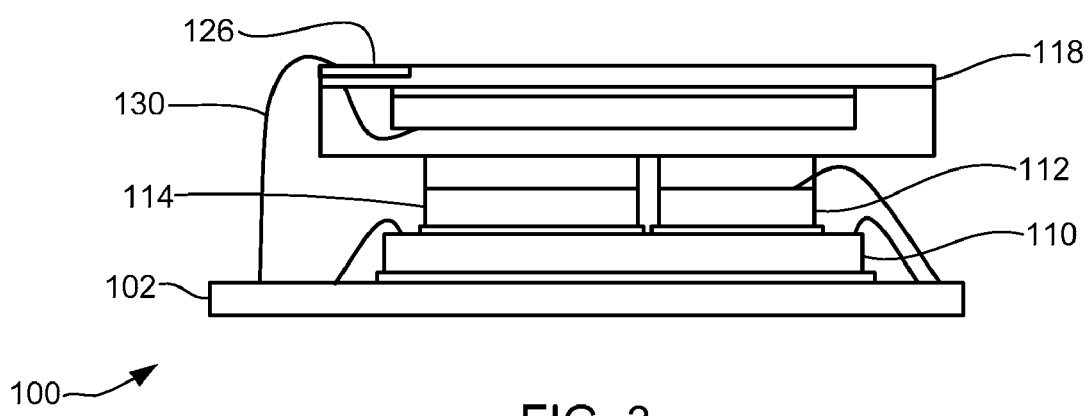
FIG. 3 is a cross-sectional view of the inter-stacking module system of FIG. 1, in a preheat for molding phase.

Referring now to FIG. 3, therein is shown a cross-sectional view of the inter-stacking module system 100, in a pre-heat for molding phase. The cross-sectional view shows the first substrate 102, the first integrated circuit 110, the second integrated circuit 112, the integrated circuit spacer 114, in a non-warped position. The inter-stacking module system 100 is in a pre-heat molding phase in preparation for encapsulating with the second molding compound 132 of FIG. 1. The second molding compound 132 of FIG. 1 holds the first substrate 102, the first integrated circuit 110, the second integrated circuit 112, the integrated circuit spacer 114 and the bond wires 130 in place and mitigates warpage.

In the manufacturing process, much of the yield fall out occurs at the injection molding phase. The bond wires 130 that have been stressed or cracked by the heat block wire bonding phase, of FIG. 3, usually separate from their connections under the force of injecting the second molding compound 132. The pre-heat molding phase is intended to relax the stresses imparted by other phases of manufacture. The temperature of the individual components will rapidly increase when the second molding compound 132 is injected around them. Without the pre-heat phase, the additional stress of rapidly elevating temperature would further damage and warp the inter-stacking module system 100.

Figure 4:
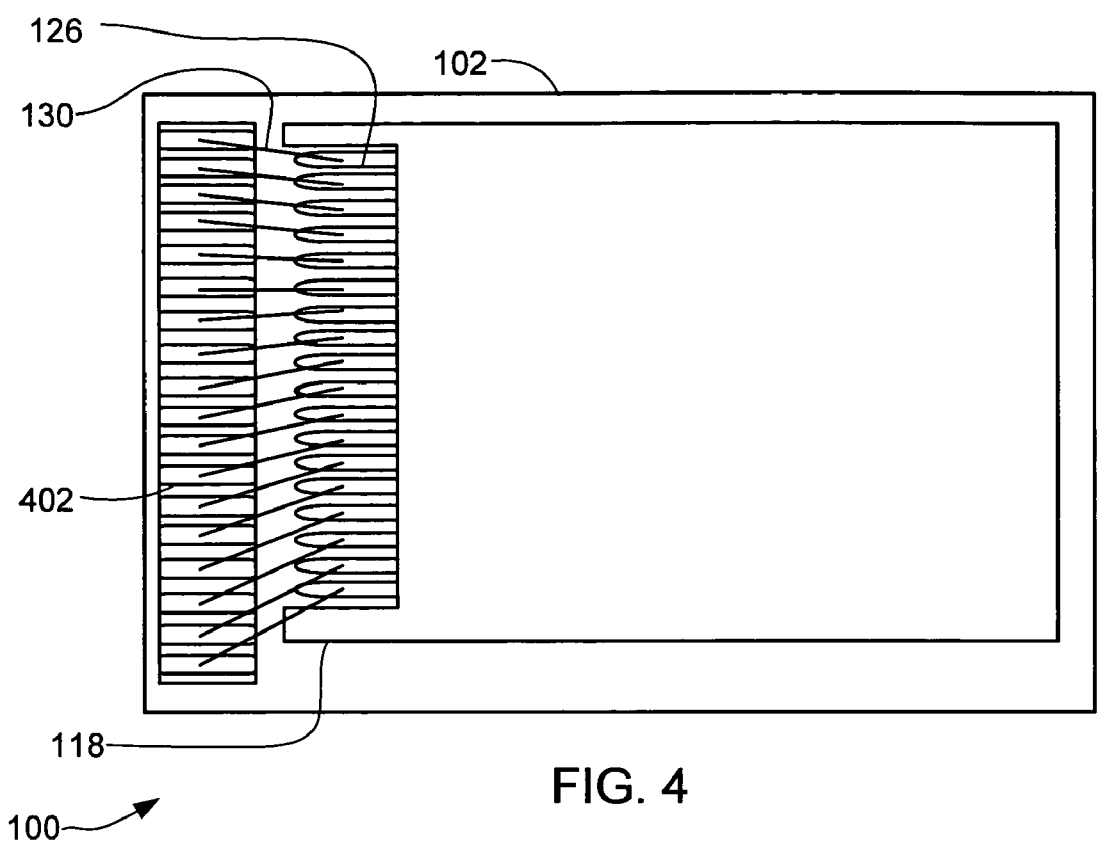
FIG. 4 is a top view of the inter-stacking module system as shown in FIG. 3.

Referring now to FIG. 4 therein is shown a top view of the inter-stacking module system 100. The top view shows the first substrate 102, the inter-stacking module substrate 118, the inter-stacking module bonding pad 126, the bond wires 130 and a first bond pad 402. A number of instances of the first bond pad 402 are aligned in a row, on the first substrate 102, parallel to a number of instances of the inter-stacking module bonding pad 126 aligned in a row, on the inter-stacking module substrate 118. The bond wires 130 are separated by a predetermined distance that prevents them from contacting each other in the injection of the second molding compound 132. The bond wires 130 form an arc, as shown in FIG. 3. The intent of the arc is to allow the additional length of the bond wires 130 to move during the manufacturing processes without asserting undue pressure on the first bond pad 402 or the inter-stacking module bonding pad 126.

The placement of the inter-stacking module bonding pad 126, at the edge of the inter-stacking module substrate 118, allows attachment of the bond wires 130 without having an elevated obstacle, such as solder mask, at the edge of the inter-stacking module substrate 118. The number of instances of the inter-stacking module bonding pad 126, aligned in a row, provides a single level attachment area for the bond wires 130. The removal of obstacles, such as solder mask, at the edge of the inter-stacking module substrate 118 enables the use of shorter lengths of the bond wires 130. The shorter lengths of the bond wires 130 can reduce manufacturing defects by removing the excess wire that could short together and ease manufacturing costs.

The placement of the inter-stacking module substrate 118 relative to the first substrate 102 allows the bond wires 130 to maintain a predetermined wire length for the arc, but not an excessive amount. Excessive length of the bond wires 130 may lead to short circuits as the individual instances of the bond wires 130 can contact each other. The placement of the individual instances of the inter-stacking module bonding pad 126 are at a predetermined distance to assure the bond wires 130 do not contact each other. A similar situation exists on the first substrate 102. The individual instances of the first bond pad 402 are at a predetermined distance from each other to assure the bond wires 130 do not make contact.

The predetermined distance of the first bond pad 402 on the first substrate 102 is spaced at a greater distance than the spacing of the inter-stacking module bonding pad 126 on the inter-stacking module substrate 118. The greater distance of the individual instances of the first bond pad 402 is required to assure the individual arcs of the bond wires 130 do not make contact with the injection of the second molding compound 132. Some care must be taken to assure that an angle formed between the individual instances of the inter-stacking module bonding pad 126 and the corresponding individual instance of the first bond pad 402 does not exceed a predetermined maximum angle that the wire bonding machine (not shown) can produce. If the angle exceeds the predetermined maximum angle, the manufacturing process can be slowed in order to reposition the device in the wire bonding machine (not shown).

Figure 5:
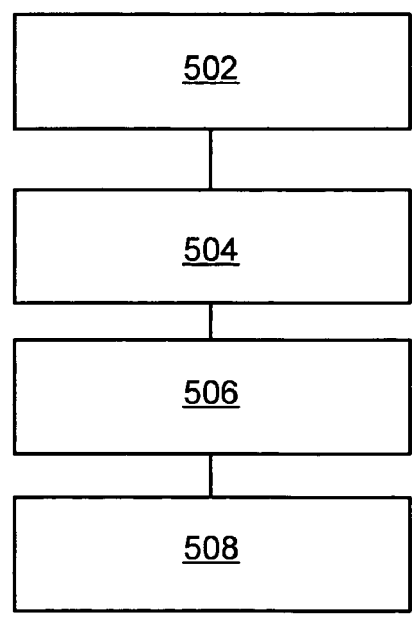
FIG. 5 is a flow chart of a system for inter-stacking module system in an embodiment of the present invention.

Referring now to FIG. 5, therein is shown a flow chart of a inter-stacking module system 500 for the inter-stacking module system 100 in an embodiment of the present invention. The system 500 includes providing mounting an integrated circuit on a first substrate, the first substrate having a first bond pad in a block 502; mounting an inter-stacking module substrate over the integrated circuit in a block 504; forming an inter-stacking module bonding pad on the inter-stacking module substrate in a block 506; and connecting bond wires between the inter-stacking module bonding pad and the first bond pad in a block 508.

In greater detail, a method to fabricate the inter-stacking module system 100, according to an embodiment of the present invention, is performed as follows:
1. Mounting a first integrated circuit 110 on a first substrate 102, the first substrate having a first bond pad 402, wherein the first bond pad 402 is aligned in a row on the first substrate 102. (FIG. 1)
2. Mounting an inter-stacking module substrate 118 over the first integrated circuit 110. (FIG. 1)
3. Forming an inter-stacking module bonding pad 126 on the inter-stacking module substrate 118, wherein multiple instances of the inter-stacking module bonding pad 126 are aligned in a row parallel to multiple instances of the first bond pad 402, aligned in a row, on the first substrate 102. (FIG. 4)
4. Connecting bond wires 130 between the inter-stacking module bonding pad 126 and the first bond pad 402. (FIG. 4)

It has been discovered that the present invention thus has numerous aspects.

It has been discovered that the inter-stacking module system provides a low cost manufacturing solution by reducing the stress on bond wire connections during the manufacturing process, simplifying some manufacturing equipment design, alleviates the need for some stringent processes to lower cost processes, and eliminates other causes that may result in potential yield issues.

An aspect is that the present invention reduces the stress on bond wire connections, by removing the solder mask material at the edge of the inter-stacking module substrate. This change utilizes existing manufacturing equipments and processes and represents an elegant solution to a vexing yield problem in the package in package product environment.

Another aspect of the present invention is that the bond wires connecting the inter-stacking module substrate to the first substrate are shorter than they were in the past. This represents a cost savings over the millions of packages that are produced each year.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the inter-stacking module system method and apparatus of the present invention furnish important and heretofore unknown and unavailable solutions, capabilities, and functional aspects for wire bonding stacked modules in the package in package environment. The resulting processes and configurations are straightforward, cost-effective, uncomplicated, highly versatile and effective, can be implemented by adapting known technologies, and are thus readily suited for efficiently and economically manufacturing package in package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. An inter-stacking module system comprising:
a first substrate, the first substrate having a first bond pad;
a first integrated circuit mounted directly on the first substrate;
a second integrated circuit mounted directly on a surface of the first integrated circuit;
an integrated circuit spacer mounted directly on the surface of the first integrated circuit and spaced apart from the second integrated circuit;
an inter-stacking module substrate mounted with a center thereof over and between the integrated circuit spacer and the second integrated circuit includes a direct electrical connection between a module integrated circuit, mounted on the inter-stacking module substrate, and inter-stacking module bonding pads exposed from an outer peripheral vertical side of the inter-stacking module substrate and exposed from a module substrate bottom, with a solder mask isolated from a region between all of the inter-stacking module bonding pads on the outer peripheral vertical side;
bond wires directly connected between the inter-stacking module bonding pad-pads and the first bond pad;
further comprising instances of the inter-stacking module bonding pads aligned in a row on the inter-stacking module substrate;
instances of the first bond pad aligned in a row on the first substrate and parallel to the row of instances of the inter-stacking module bond pads;
further comprising a package in package device comprising:
an integrated circuit mounted directly on a module substrate to of the inter-stacking module substrate and connected to the inter-stacking module bond pads with the bond wires;
a molding compound encases the integrated circuit, the bond wires and the module substrate to of the inter-stacking module substrate; and a stacking module spacer adhered to the molding compound and mounted over the integrated circuit on the first substrate.

2. The system as claimed in claim 1 further comprising a row of the inter-stacking module bonding pads on the inter-stacking module substrate.

3. The system as claimed in claim 1 further comprising a parallel row of first bond pads aligned with a parallel row of the inter-stacking module bonding pads.

4. The system as claimed in claim 1 wherein the inter-stacking module bonding pads comprise placing the inter-stacking module bonding pads at an edge of the inter-stacking module substrate.

5. The system as claimed in claim 1 further comprising a second molding compound around the inter-stacking module substrate, the bond wires and a first top side of the first substrate and a stacking module spacer adhered to a first molding compound.

6. The system as claimed in claim 1 further comprising an edge of the inter-stacking module substrate with the inter-stacking module bonding pads positioned on the edge of the inter-stacking module substrate.

7. The system as claimed in claim 1 further comprising a molding compound around the inter-stacking module substrate, the bond wires and a first top side of the first substrate.

8. The system as claimed in claim 1 further comprising a second integrated circuit stacked between the first integrated circuit mounted on the first substrate and the stacking module mounted over the first substrate.

* * * * *

UNITED STATES PATENT AND TRADEMARK OFFICE
CERTIFICATE OF CORRECTION

PATENT NO. : 8,410,594 B2  
APPLICATION NO. : 11/330930  
DATED : April 2, 2013  
INVENTOR(S) : Hwang et al.

Page 1 of 1

It is certified that error appears in the above-identified patent and that said Letters Patent is hereby corrected as shown below:

In the Claims:

1. Column 6, claim 1, line 52, delete "bonding pad-pads and" and insert therefor --bonding pads and--

2. Column 6, claim 1, line 62, delete "to of the" and insert therefor --top of the--

3. Column 6, claim 1, line 66, delete "to of the" and insert therefor --top of the--

Signed and Sealed this  
First Day of December, 2015

Michelle K. Lee  
*Director of the United States Patent and Trademark Office*